(12) United States Patent
Oohashi et al.

(10) Patent No.: US 11,357,110 B2
(45) Date of Patent: Jun. 7, 2022

(54) ELECTRONIC COMPONENT

(71) Applicant: TDK Corporation, Tokyo (JP)

(72) Inventors: Takeshi Oohashi, Tokyo (JP); Shinichiro Toda, Tokyo (JP); Daiki Kusunoki, Tokyo (JP); Takashi Ohtsuka, Tokyo (JP); Kazuhiro Yoshikawa, Tokyo (JP); Kenichi Yoshida, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/132,626

(22) Filed: Dec. 23, 2020

(65) Prior Publication Data

US 2021/0204406 A1 Jul. 1, 2021

(30) Foreign Application Priority Data

Dec. 26, 2019 (JP) .............................. JP2019-236998

(51) Int. Cl.
| | |
|---|---|
| *H05K 1/16* | (2006.01) |
| *H01G 4/228* | (2006.01) |
| *H01G 4/33* | (2006.01) |
| *H01G 4/40* | (2006.01) |
| *H01L 49/02* | (2006.01) |

(52) U.S. Cl.
CPC ............. *H05K 1/165* (2013.01); *H01G 4/228* (2013.01); *H01G 4/33* (2013.01); *H01G 4/40* (2013.01);
(Continued)

(58) Field of Classification Search
CPC ........ H05K 1/0233; H05K 1/16; H05K 1/162; H05K 1/165; H05K 2201/0175; H05K 2201/0179; H05K 2201/0195; H05K 2201/095
(Continued)

(56) References Cited

U.S. PATENT DOCUMENTS

| | | | | |
|---|---|---|---|---|
| 6,590,473 B1 * | 7/2003 | Seo | .......................... | H01L 27/08 333/185 |
| 6,975,186 B2 * | 12/2005 | Hirabayashi | ............ | H01P 1/203 333/204 |

(Continued)

FOREIGN PATENT DOCUMENTS

| | | |
|---|---|---|
| JP | 09-198580 A | 7/1997 |
| JP | 2001-267512 A | 9/2001 |

(Continued)

OTHER PUBLICATIONS

Japanese Notice of Reasons for Refusal issued in corresponding Japanese Patent Application No. 2019-236998, dated Nov. 9, 2021, with English translation.

*Primary Examiner* — Hoa C Nguyen
(74) *Attorney, Agent, or Firm* — McDermott Will & Emery LLP

(57) ABSTRACT

Disclosed herein is an electronic component that includes a first conductive layer including a lower electrode and a first inductor pattern, a dielectric film that covers the lower electrode, an upper electrode laminated on the lower electrode through the dielectric film, an insulating layer that covers the first conductive layer, dielectric film, and upper electrode, and a second conductive layer formed on the insulating layer and including a second inductor pattern. The first and second inductor patterns are connected in parallel through via conductors penetrating the insulating layer.

6 Claims, 22 Drawing Sheets

(52) U.S. Cl.
CPC .............. *H01L 28/10* (2013.01); *H01L 28/60* (2013.01); *H05K 1/162* (2013.01); *H05K 2201/0175* (2013.01); *H05K 2201/0179* (2013.01); *H05K 2201/0195* (2013.01); *H05K 2201/095* (2013.01); *H05K 2201/10007* (2013.01)

(58) Field of Classification Search
CPC ......... H05K 2201/10007; H01G 4/228; H01G 4/33; H01G 4/40; H01L 28/10; H01L 28/60
See application file for complete search history.

(56) References Cited

U.S. PATENT DOCUMENTS

| | | | |
|---|---|---|---|
| 2002/0015276 A1* | 2/2002 | Kiewitt | H04B 1/40 361/306.2 |
| 2005/0200431 A1* | 9/2005 | Lin | H03H 7/0115 333/175 |
| 2007/0109719 A1 | 5/2007 | Kuwajima et al. | |
| 2008/0023219 A1 | 1/2008 | Yoshizawa et al. | |
| 2009/0097219 A1* | 4/2009 | Cho | H03H 7/0107 361/763 |
| 2012/0212919 A1 | 8/2012 | Mano et al. | |
| 2013/0223033 A1 | 8/2013 | Mano et al. | |
| 2017/0092556 A1* | 3/2017 | Gustafson | H01L 21/4846 |
| 2017/0133997 A1* | 5/2017 | Imamura | H01F 27/2804 |
| 2017/0338034 A1* | 11/2017 | Yun | H01F 17/00 |

FOREIGN PATENT DOCUMENTS

| | | |
|---|---|---|
| JP | 2004-095777 A | 3/2004 |
| JP | 2007-142109 B2 | 6/2007 |
| JP | 2008-034626 B2 | 2/2008 |

* cited by examiner

ELECTRONIC COMPONENT

BACKGROUND OF THE INVENTION

Field of the Invention

The present invention relates to an electronic component and, more particularly, to an electronic component having a capacitor and an inductor.

Description of Related Art

JP 2007-142109A and JP 2008-34626A disclose an electronic component having a capacitor and an inductor formed on a substrate. The capacitor described in JP 2007-142109A and JP 2008-34626A includes a lower electrode and inductor pattern which are formed in a conductive layer as the lowermost layer, a dielectric film that covers the lower electrode and inductor pattern, and an upper electrode that faces the lower electrode through the dielectric film. In electronic components of such a type, a good conductor such as copper is used for the conductive layer, and an inorganic insulating material such as silicon nitride is used for the dielectric film.

An inorganic insulating material such as silicon nitride has high stress, which may cause interfacial peeling of the lower electrode or inductor pattern. Such peeling becomes significant as the thickness of the lower electrode or inductor pattern increases, so that to prevent peeling, it is necessary to reduce the thickness of the conductive layer constituting the lower electrode and inductor pattern to reduce a level difference. However, a reduction in the conductor thickness of the inductor pattern increases a resistance value, leading to deterioration in characteristics. Such a disadvantage can occur not only in the case where the inorganic insulating material is used for the dielectric film, but in the case where other materials having high stress are used therefor.

SUMMARY

It is therefore an object of the present invention to provide an electronic component having a capacitor and an inductor, capable of reducing the resistance value of an inductor pattern while preventing interfacial peeling between a capacitor lower electrode and a dielectric film and between the inductor pattern and the dielectric film.

An electronic component according to the present invention includes: a first conductive layer including a lower electrode and a first inductor pattern; a dielectric film that covers the lower electrode; an upper electrode laminated on the lower electrode through the dielectric film; an insulating layer that covers the first conductive layer, dielectric film, and upper electrode; and a second conductive layer formed on the insulating layer and including a second inductor pattern. The first and second inductor patterns are connected in parallel through via conductors penetrating the insulating layer.

According to the present invention, the first and second inductor patterns are connected in parallel, so that even when the conductor thickness of the first conductive layer is reduced, the resistance value of the inductor pattern can be reduced. This makes it possible to reduce the resistance value of the inductor pattern while preventing interfacial peeling between the capacitor lower electrode and the dielectric film and between the inductor pattern and the dielectric film.

In the present invention, the first conductive layer may be smaller in thickness than the second conductive layer. This further reduces a level difference in the first conductive layer, making it possible to prevent interfacial peeling between the capacitor lower electrode and the dielectric film and between the inductor pattern and the dielectric film more effectively.

In the present invention, the first and second inductor patterns may have the same pattern shape. This facilitates connection between the first and second inductor patterns.

In the present invention, the via conductor may be formed so as to connect the first and second inductor patterns at their both ends or may be formed so as to connect them at a position between their both ends as well as at their both ends. An increase in the number of the via conductors connecting the first and second inductor patterns can make current distribution more uniform.

The electronic component according to the present invention may further include a passivation film that covers the upper electrode at a region where the upper electrode is present and covers the dielectric film at a region where the upper electrode is absent, and the dielectric film and the passivation film both may be made of an inorganic insulating material. When both the dielectric film and passivation film are made of an inorganic insulating material, a high stress is generated in a laminated film of the dielectric film and passivation film; however, even in such a case, peeling can be prevented by reducing the conductor thickness of the first conductive layer.

As described above, according to the present invention, there can be provided an electronic component having a capacitor and an inductor, capable of reducing the resistance value of an inductor pattern while preventing interfacial peeling between the capacitor lower electrode and the dielectric film and between the inductor pattern and the dielectric film.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
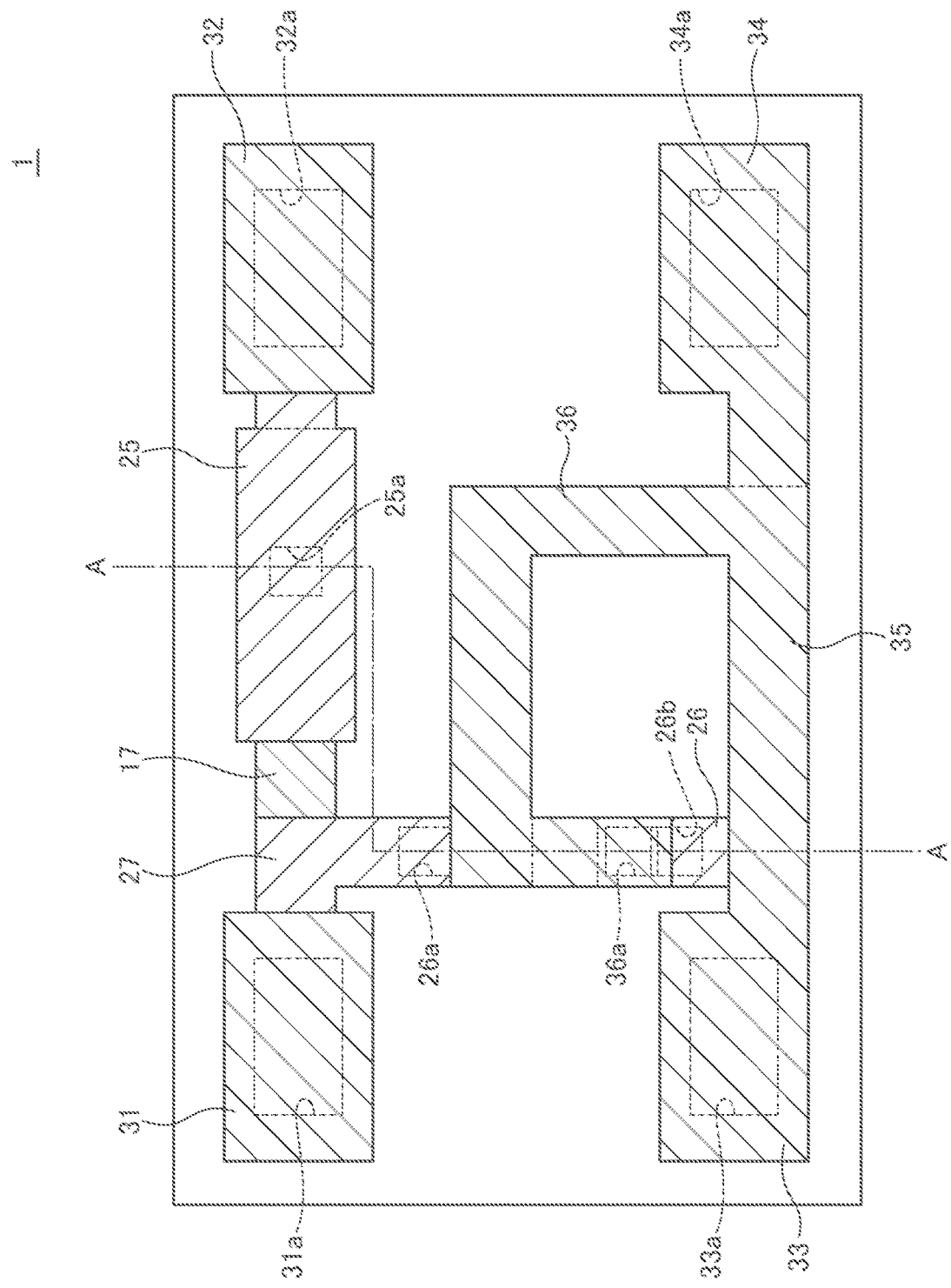
FIG. 1 is a schematic plan view for explaining the structure of an electronic component according to an embodiment of the present invention.
Figure 2:
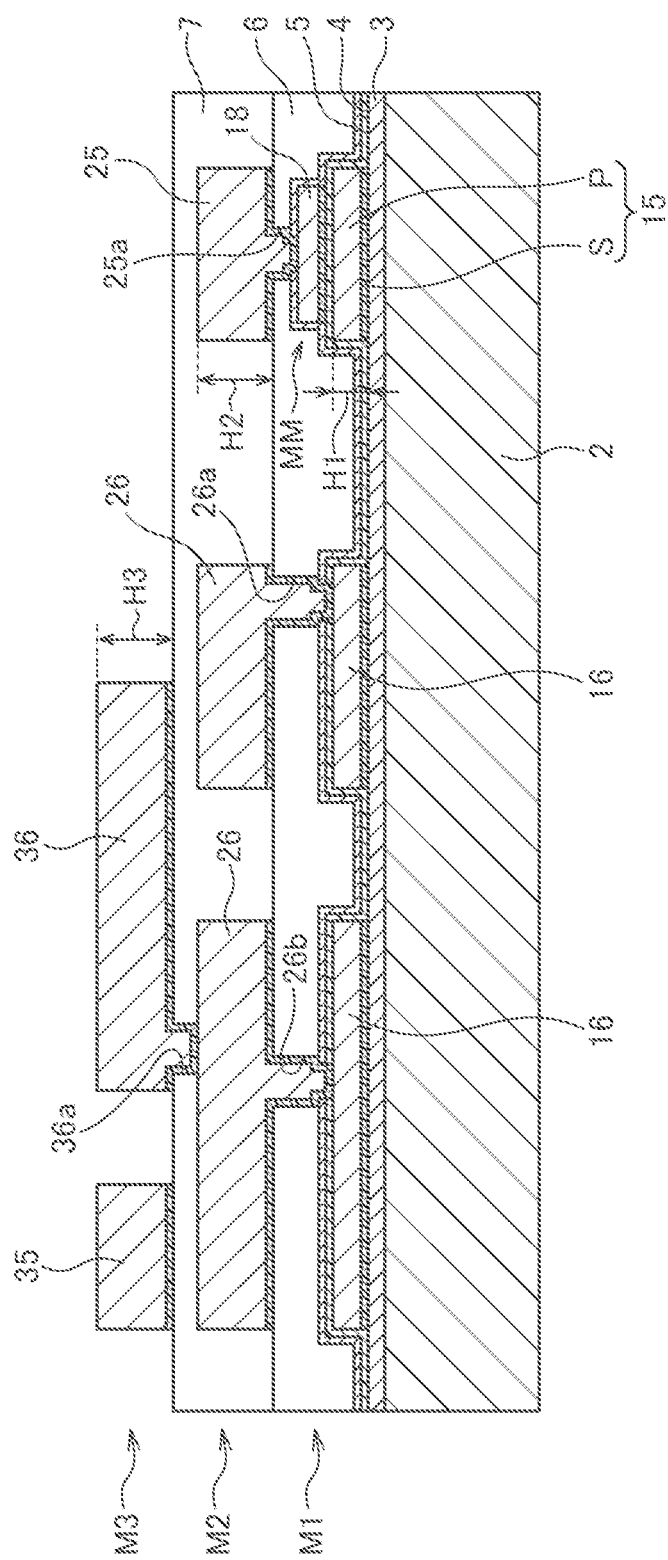
FIG. 2 is a schematic cross-sectional view taken along line A-A in FIG. 1.

FIG. 1 is a schematic plan view for explaining the structure of an electronic component 1 according to an embodiment of the present invention. FIG. 2 is a schematic cross-sectional view taken along line A-A in FIG. 1.

Figure 3:
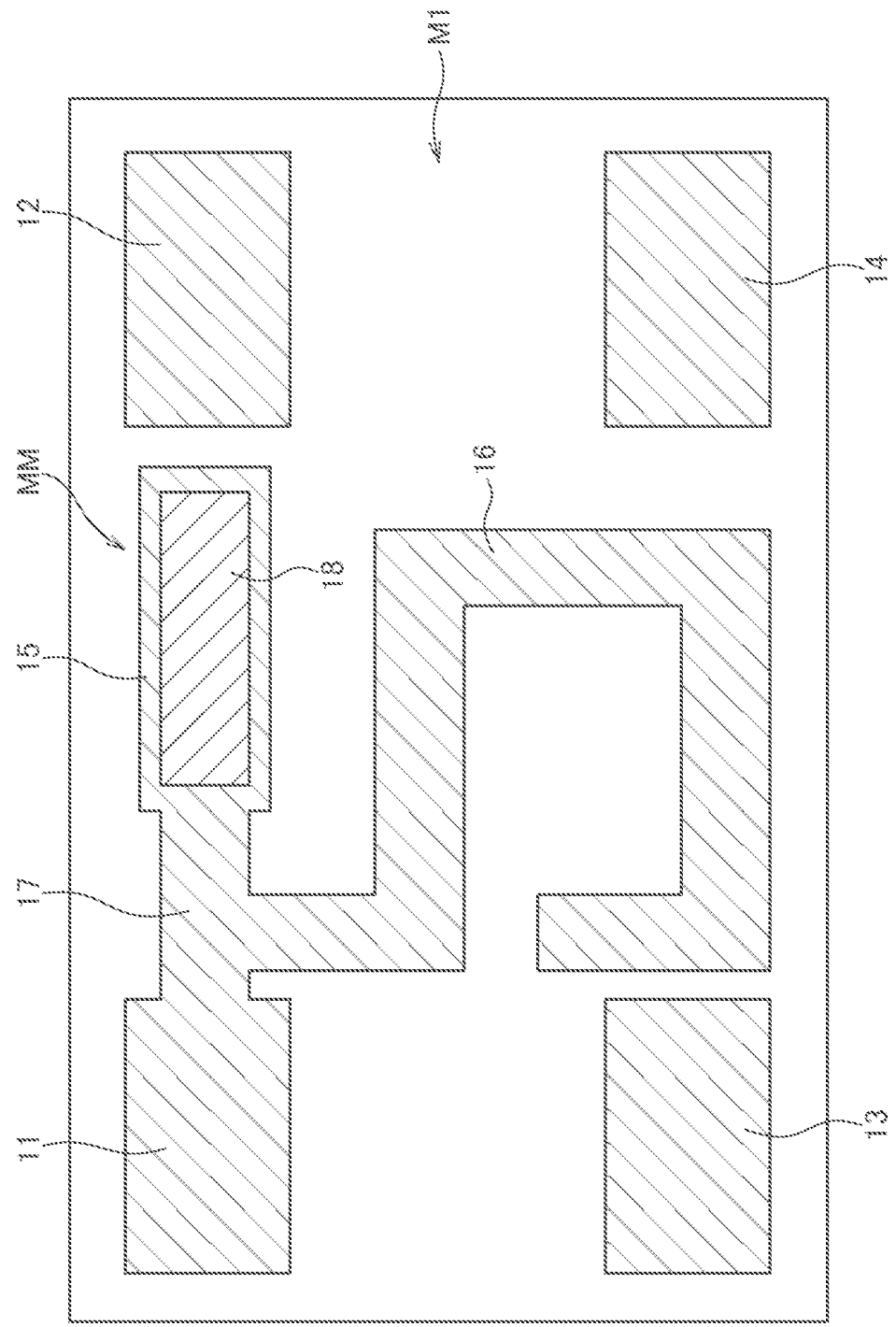
FIG. 3 is a schematic plan view for explaining pattern shapes of conductive layers M1 and MM.
Figure 4:
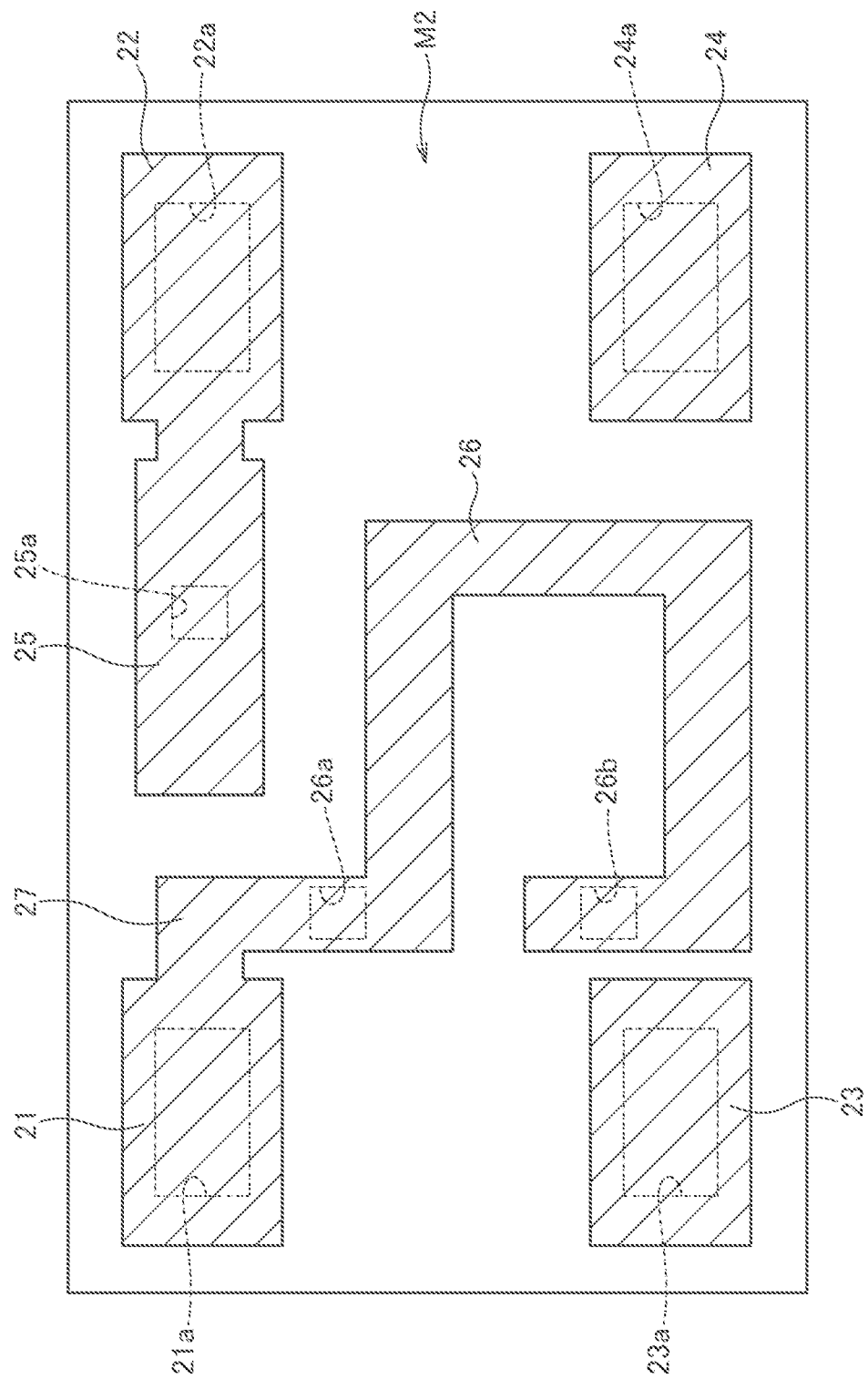
FIG. 4 is a schematic plan view for explaining a pattern shape of a conductive layer M2.
Figure 5:
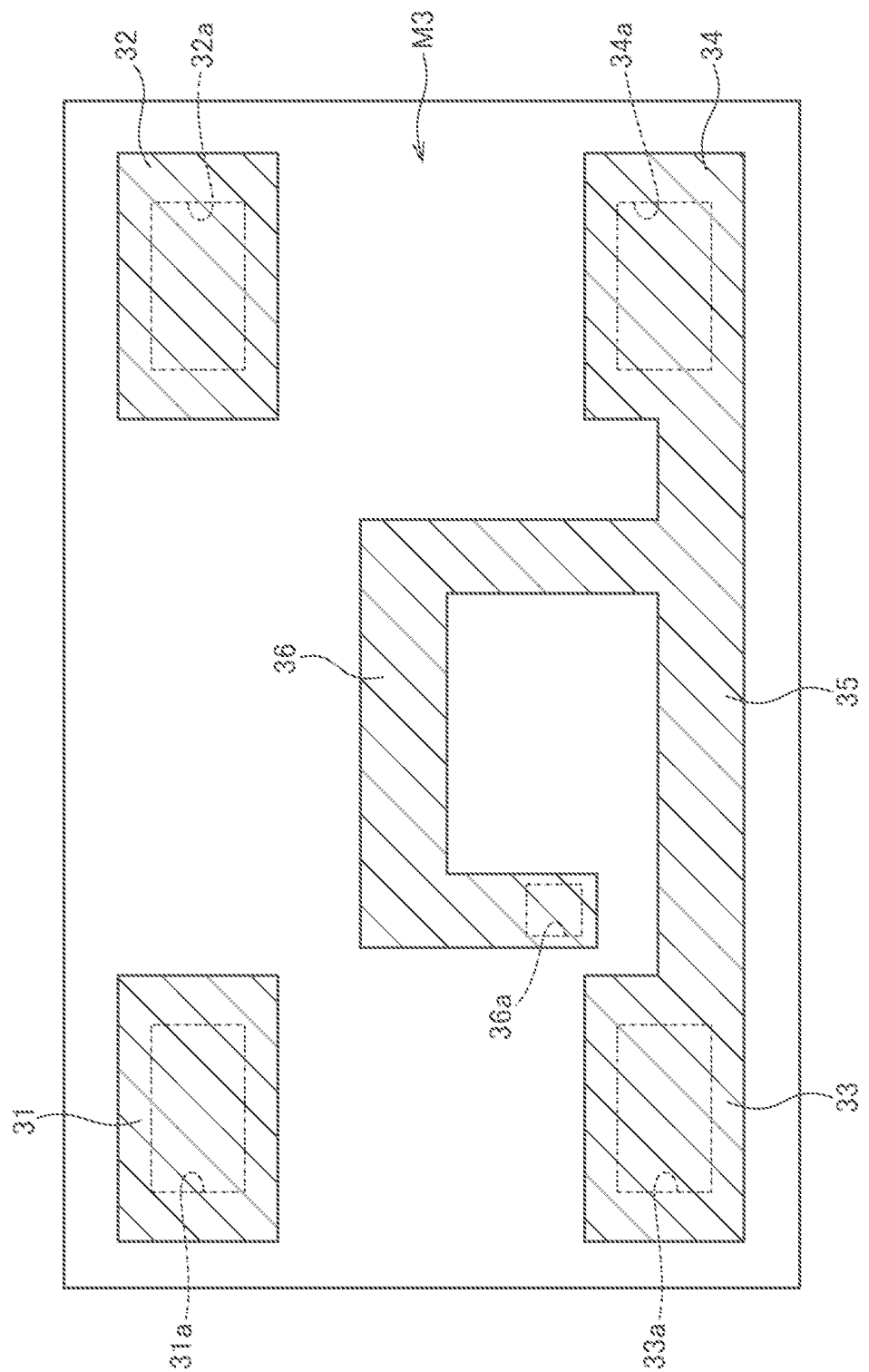
FIG. 5 is a schematic plan view for explaining a pattern shape of a conductive layer M3.

The electronic component 1 according to the present embodiment is an LC filter and includes, as illustrated in FIGS. 1 and 2, a substrate 2, conductive layers M1, MM, M2, M3 and insulating layers 6, 7 which are formed on the main surface of the substrate 2. The pattern shapes of the conductive layers M1 and MM are illustrated in FIG. 3, the pattern shape of the conductive layer M2 is illustrated in FIG. 4, and the pattern shape of the conductive layer M3 is illustrated in FIG. 5. The material for the substrate 2 may be any material as long as it is chemically and thermally stable, generates less stress, and can maintain surface smoothness, and examples thereof include, but not particularly limited thereto, silicon single crystal, alumina, sapphire, aluminum nitride, MgO single crystal, $SrTiO_3$ single crystal, surface-oxidized silicon, glass, quartz, and ferrite. The surface of the substrate 2 is covered with a planarizing layer 3. The planarizing layer 3 may be made of, e.g., alumina or silicon oxide.

The conductive layer M1 is a conductive layer positioned in the lowermost layer and includes conductive patterns 11 to 17 as illustrated in FIG. 3. The conductive patterns 11 to 14 are terminal electrode patterns, the conductive pattern 15 is a capacitor lower electrode, and the conductive pattern 16 is an inductor pattern. One end of the conductive pattern 15 constituting the lower electrode and one end of the conductive pattern 16 constituting the inductor pattern are connected to the conductive pattern 11 by way of the conductive pattern 17. The conductive patterns 11 to 17 are each constituted of a thin seed layer S contacting the planarizing layer 3 and a plating layer P formed on the seed layer S and having a film thickness larger than that of the seed layer S. Similarly, the conductive patterns positioned in the conductive layers MM, M2, and M3 are each formed of a laminated body of the seed layer S and plating layer P. Of the conductive patterns 11 to 17, at least the conductive pattern 15 constituting the capacitor lower electrode is covered at the upper and side surfaces thereof with a dielectric film (capacitive insulating film) 4.

A conductive pattern 18 is formed on the upper surface of the conductive pattern 15 through the dielectric film 4. The conductive pattern 18 belongs to the conductive layer MM positioned between the conductive layers M1 and M2 and constitutes a capacitor upper electrode. This forms a capacitor having the lower and upper electrodes constituted by the conductive patterns 15 and 18, respectively. The conductive layers M1 and MM are covered with the insulating layer 6 through a passivation film 5. In the present embodiment, the dielectric film 4 and the passivation film 5 are each made of an inorganic insulating material. The dielectric film 4 and the passivation film 5 may be made of the same or different inorganic insulating materials.

The conductive layer M2 is the second conductive layer, which is provided on the surface of the insulating layer 6. As illustrated in FIG. 4, the conductive layer M2 includes conductive patterns 21 to 27. The conductive patterns 21 to 24 are terminal electrode patterns, the conductive pattern 25 is a lead-out electrode of the capacitor, and the conductive pattern 26 is an inductor pattern. The conductive pattern 26 has the same pattern shape as the conductive pattern 16 and formed in the same plane position. Accordingly, the conductive patterns 16 and 26 overlap each other in a plan view. The conductive pattern 25 is connected to the conductive pattern 18 as the upper electrode through a via conductor 25a penetrating the insulating layer 6 and connected also to the conductive pattern 22. One end of the conductive pattern 26 constituting the inductor pattern is connected to the conductive pattern 21 through the conductive pattern 27 and connected also to one end of the conductive pattern 16 through a via conductor 26a penetrating the insulating layer 6. The other end of the conductive pattern 26 is connected to the other end of the conductive pattern 16 through a via conductor 26b penetrating the insulating layer 6. The conductive patterns 21 to 24 are connected respectively to the conductive patterns 11 to 14 through via conductors 21a to 24a penetrating the insulating layer 6.

The conductive layer M3 is the third conductive layer, which is provided on the surface of the insulating layer 7. As illustrated in FIG. 5, the conductive layer M3 includes conductive patterns 31 to 36. The conductive patterns 31 to 34 are terminal electrode patterns, the conductive pattern 35 is an inductor lead-out electrode, and the conductive pattern 36 is an inductor pattern. One end of the conductive pattern 36 constituting the inductor pattern is connected to the other end of the conductive pattern 26 through a via conductor 36a penetrating the insulating layer 7, and the other end thereof is connected to the conductive patterns 33 and 34 through the conductive pattern 35. The conductive patterns 31 to 34 are connected respectively to the conductive patterns 21 to 24 through via conductors 31a to 34a penetrating the insulating layer 7.

Figure 6:
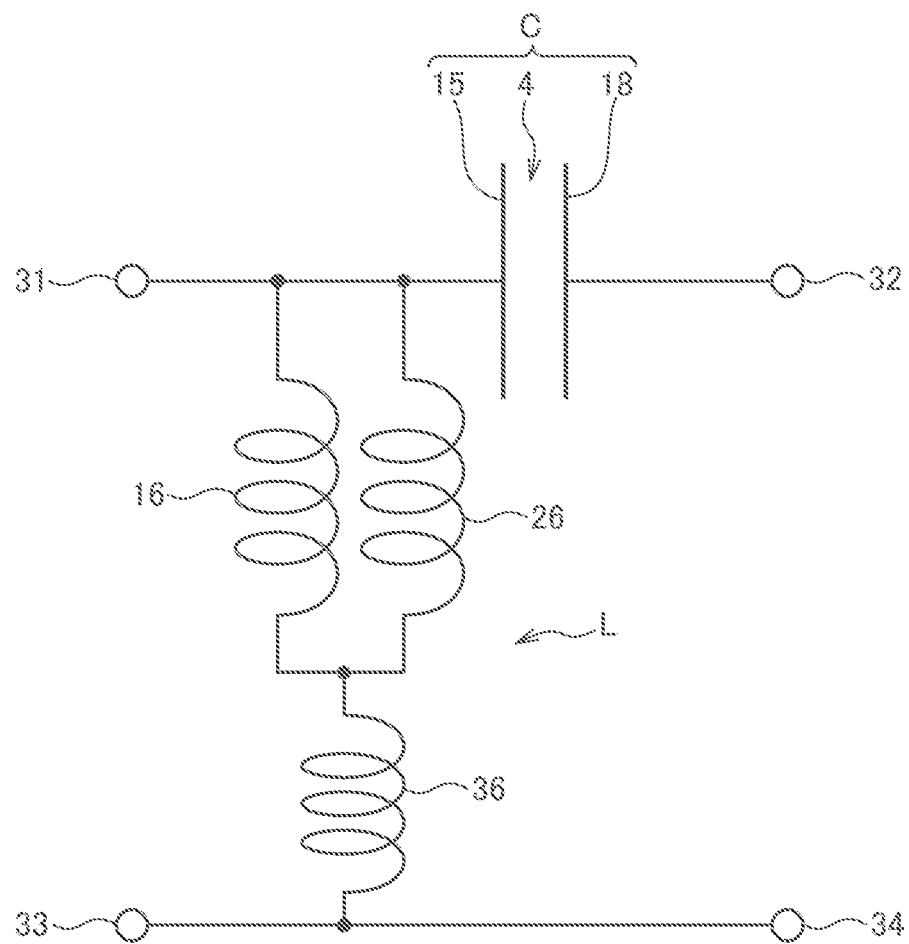
FIG. 6 is an equivalent circuit diagram of the electronic component according to an embodiment of the present invention.

FIG. 6 is an equivalent circuit diagram of the electronic component 1 according to the present embodiment.

As illustrated in FIG. 6, the electronic component 1 according to the present embodiment has a circuit configuration having a capacitor C connected between the conductive patterns 31 and 32 and an inductor L connected between the conductive pattern 31 and the conductive patterns 33, 34. The capacitor C is constituted of the conductive pattern 15 as the lower electrode, the conductive pattern 18 as the upper electrode, and the dielectric film 4 positioned between the conductive patterns 15 and 18. The inductor L has a circuit configuration in which a parallel coil constituted of the conductive patterns 16 and 26 and a coil constituted of the conductive pattern 36 are connected in series.

As illustrated in FIG. 2, in the present embodiment, a conductor thickness H1 of the conductive layer M1 is smaller than a conductor thickness H2 of the conductive layer M2. A reduction in the conductor thickness H1 of the conductive layer M1 reduces a level differences formed by the dielectric film 4 and passivation film 5. This relieves a stress to make interfacial peeling between the dielectric film 4 and the conductive layer M1 less likely to occur. On the other hand, the reduction in the conductor thickness H1 of the conductive layer M1 increases the resistance value of the conductive layer M1, so that when the conductive pattern 16 belonging to the conductive layer M1 is used as an inductor pattern without any alteration, characteristics of the LC filter may deteriorate. Considering this, in the electronic component 1 according to the present embodiment, the conductive pattern 16 belonging to the conductive layer M1 and the conductive pattern 26 belonging to the conductive layer M2 are connected in parallel to reduce the resistance value. Thus, it is possible to reduce the resistance value of the inductor L while preventing interfacial peeling between the dielectric film 4 and the conductive layer M1.

Although not particularly limited, a conductor thickness H3 of the conductive layer M3 is preferably approximately equal to the conductor thickness H2 of the conductive layer M2.

Figure 7:
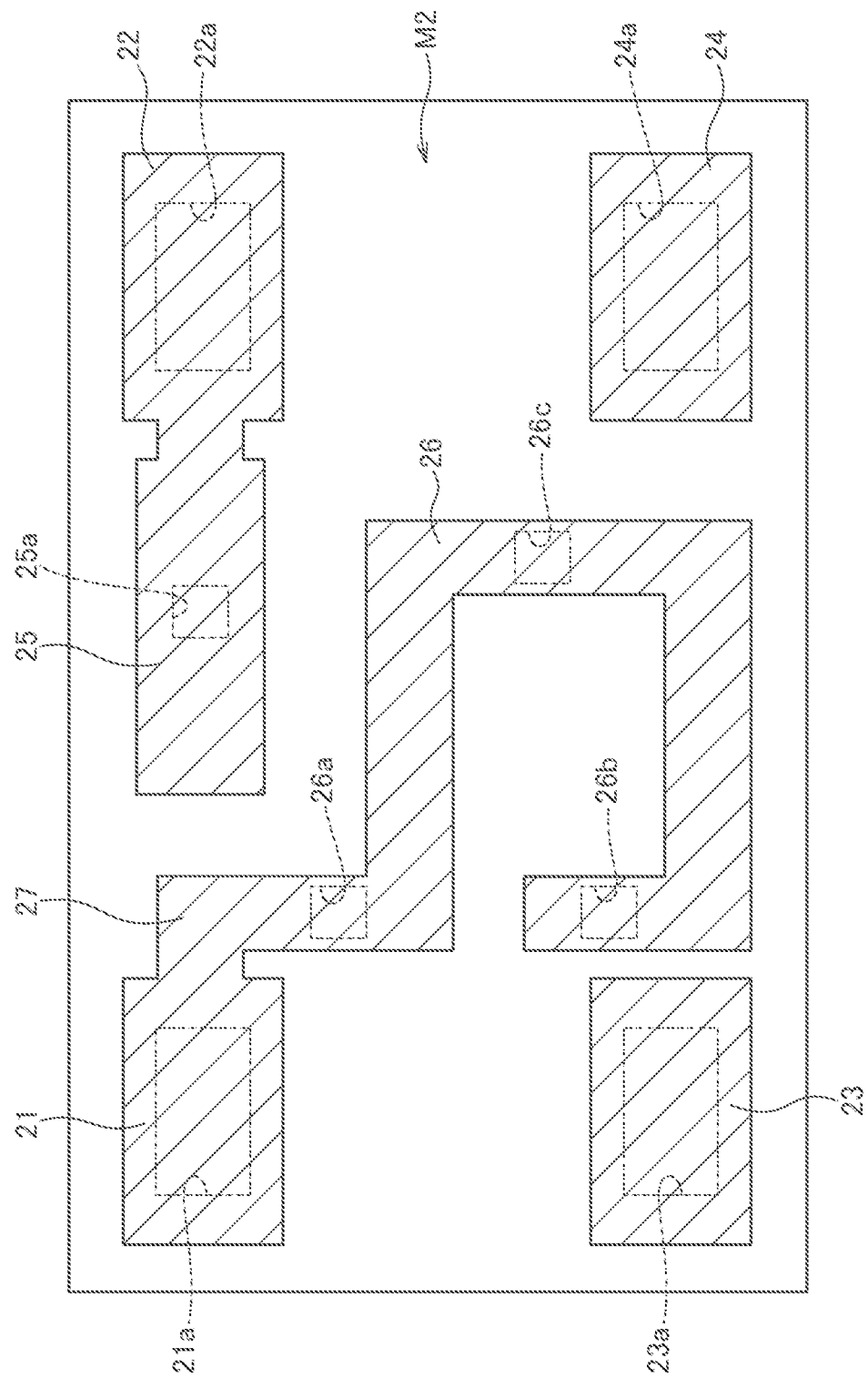
FIG. 7 is a schematic plan view for explaining a pattern shape of the conductive layer M2 according to a first modification.
Figure 8:
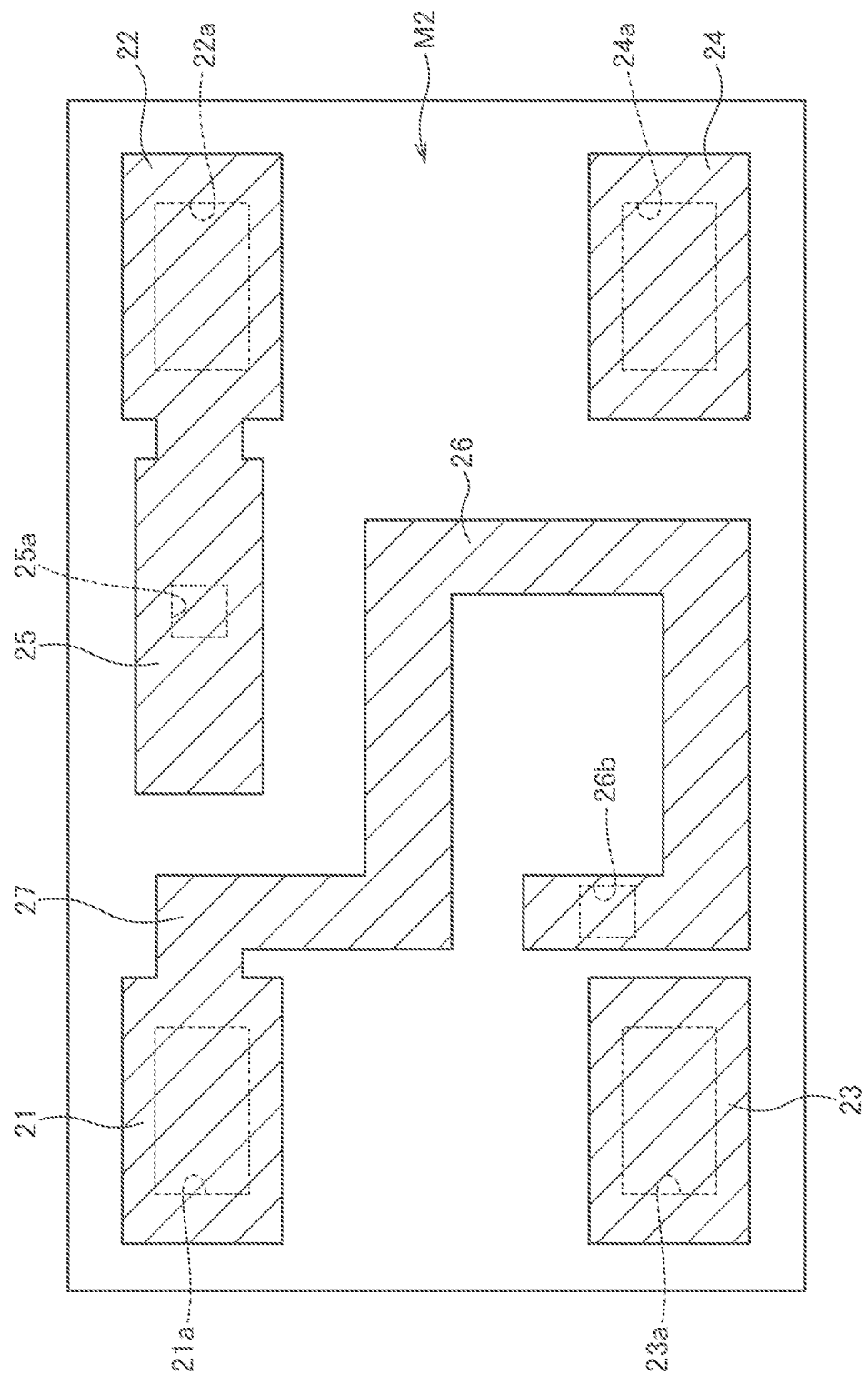
FIG. 8 is a schematic plan view for explaining a pattern shape of the conductive layer M2 according to a second modification.

The conductive pattern 16 belonging to the conductive layer M1 and the conductive pattern 26 belonging to the conductive layer M2 only need to be connected in parallel. Thus, the conductive patterns 16 and 26 may be connected to each other at their both ends through the via conductors 26a and 26b as illustrated in FIG. 4. Alternatively, the conductive patterns 16 and 26 may be connected also at their substantially intermediate portions through a via conductor 26c as well as at their both ends through the via conductors 26a and 26b as in a first modification illustrated in FIG. 7, or they may be connected only at their other ends through the via conductor 26b as in a second modification illustrated in FIG. 8. According to the first modification illustrated in FIG. 7, the number of connection portions between the conductive patterns 16 and 26 is increased to make current distribution more uniform. The number of via conductors (e.g., via conductor 26c) formed between both ends of each of the conductive patterns 16 and 26 may be two or more. Further, in the second modification illustrated in FIG. 8, the conductive patterns 11 and 21, each of which constitutes the end portion of the inductor pattern, are connected to each other through the via conductor 21a, whereby the conductive patterns 16 and 26 are connected in parallel to each other.

The following describes a manufacturing method for the electronic component 1 according to the present embodiment.

FIGS. 9 to 22 are process views for explaining the manufacturing method for the electronic component 1 according to the present embodiment. Although many pieces of the electronic components 1 are obtained from an aggregate substrate in the manufacturing process of the electronic component 1, the following description will be made focusing on the manufacturing process of one electronic component 1.

Figure 9:
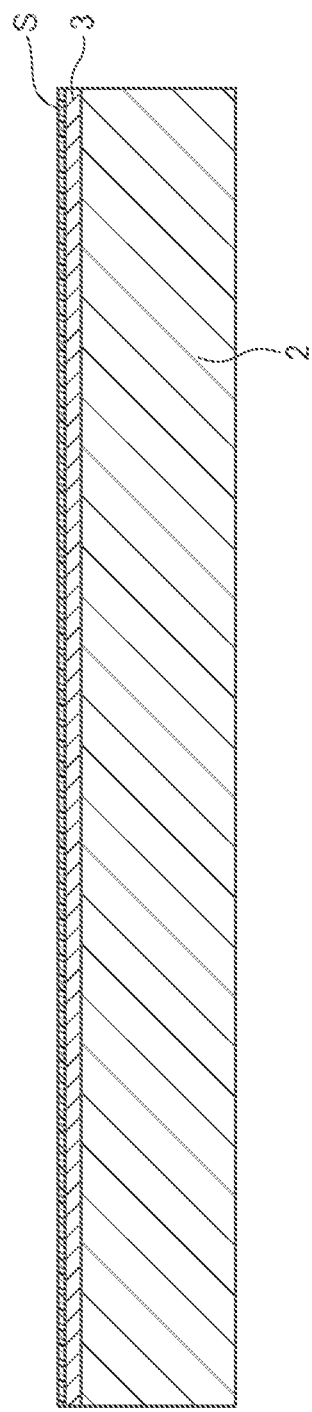
FIGS. 9 to 22 are process views for explaining the manufacturing method for the electronic component according to an embodiment of the present invention.
Figure 10:
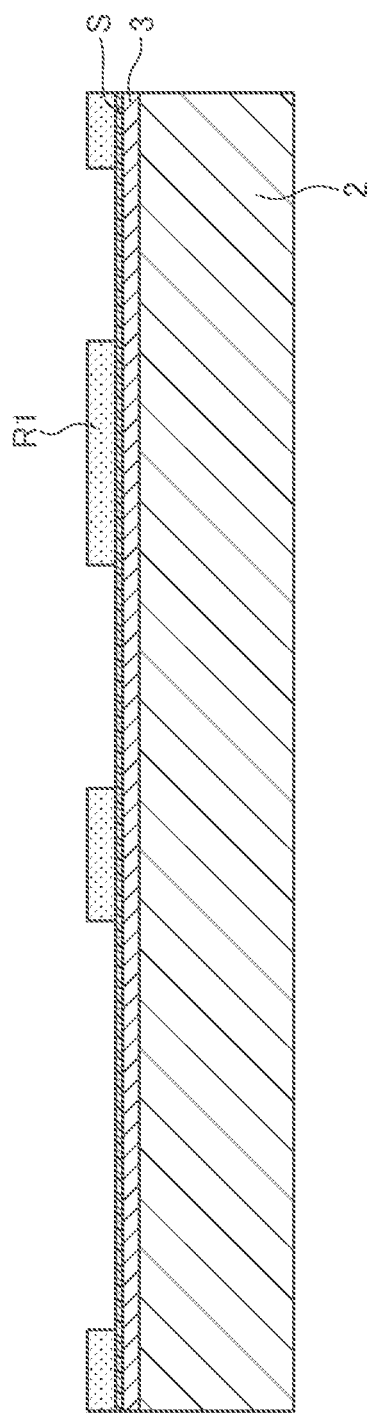
Figure 11:
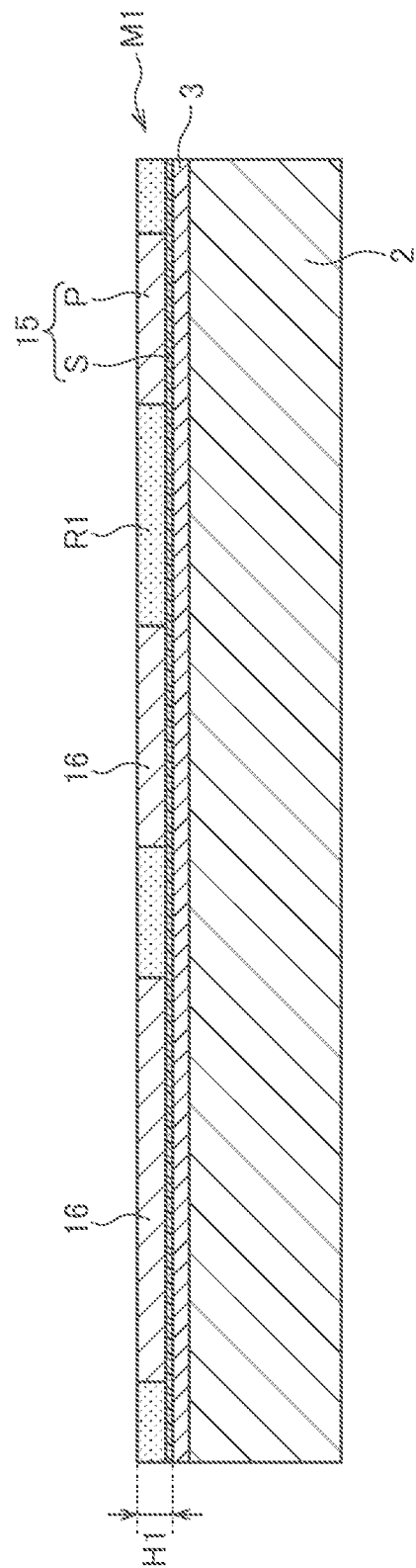
Figure 12:
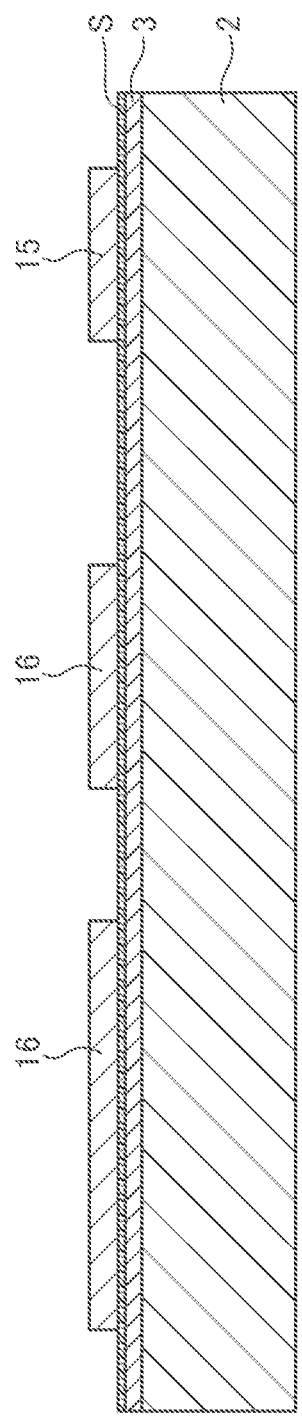
Figure 13:
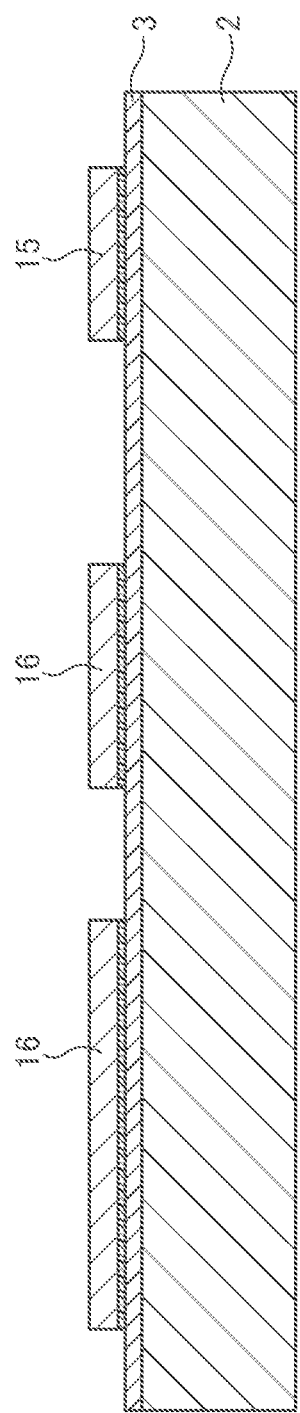

As illustrated in FIG. 9, the planarizing layer 3 is formed by sputtering or other methods on the substrate (aggregate substrate) 2, and the surface of the planarizing layer 3 is subjected to grinding or mirror finishing such as CMP for planarization. Thereafter, the seed layer S is formed by sputtering or other methods on the surface of the planarizing layer 3. Subsequently, as illustrated in FIG. 10, a resist layer R1 is spin-coated on the seed layer S and then patterned so as to expose a part of the seed layer S on which the conductive layer M1 is to be formed. In this state, electrolyte plating is performed using the seed layer S as a feeder to form a plating layer P on the seed layer S as illustrated in FIG. 11. A laminated body of the seed layer S and plating layer P constitutes the conductive layer M1. In the cross section illustrated in FIG. 11, the conductive layer M1 includes the conductive patterns 15 and 16. The conductor thickness of the conductive layer M1 is H1. Then, the resist layer R1 is removed as illustrated in FIG. 12, and the exposed seed layer S is removed as illustrated in FIG. 13, whereby the conductive layer M1 is completed. The removal of the seed layer S can be achieved by etching or ion milling.

Figure 14:
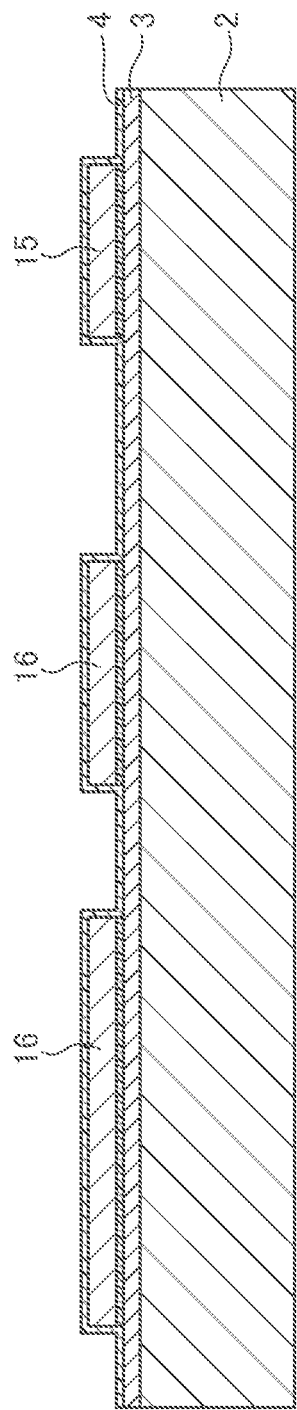

Then, as illustrated in FIG. 14, the dielectric film 4 is formed on the entire surface of the conductive layer M1 including the upper and side surfaces thereof. The dielectric film 4 may be made of, e.g., a paraelectric material such as silicon nitride (SiNx) or silicon oxide (SiOx), or a known ferroelectric material. The dielectric film 4 can be formed by sputtering, plasma CVD, MOCVD, sol-gel, electron beam vapor deposition, or other methods.

Figure 15:
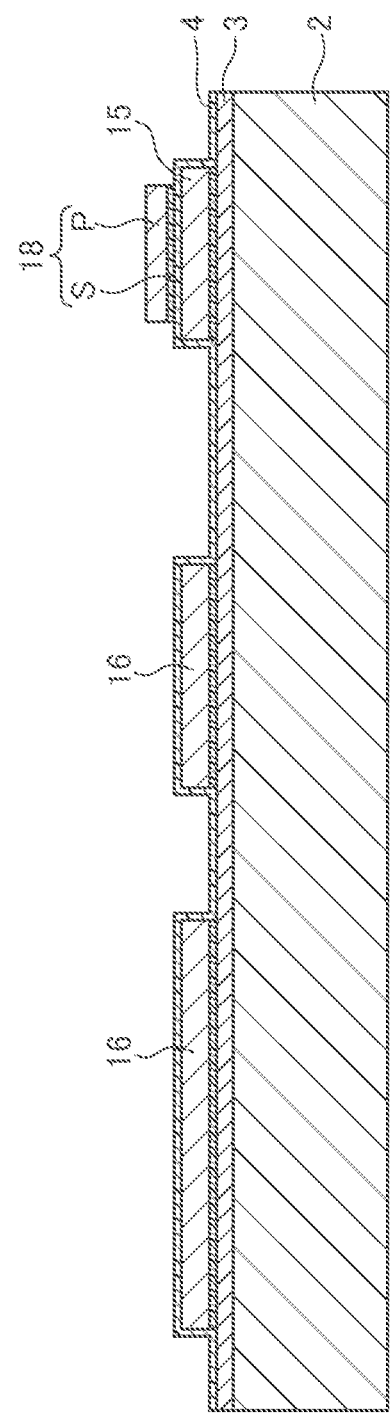

Then, as illustrated in FIG. 15, the conductive pattern 18 is formed on the upper surface of the conductive pattern 15 through the dielectric film 4 using the same method as the formation method for the conductive layer M1. The conductive pattern 18 is also formed of a laminated body of the seed layer S and plating layer P. This completes the conductive layer MM to thereby form a capacitor having the lower and upper electrodes constituted by the conductive patterns 15 and 18, respectively. Although not particularly limited, it is preferable to make the film thickness of the conductive layer MM smaller than that of the conductive layer M1. This increases processing accuracy of the conductive layer MM to reduce a variation in capacitance attributable to processing accuracy.

Figure 16:
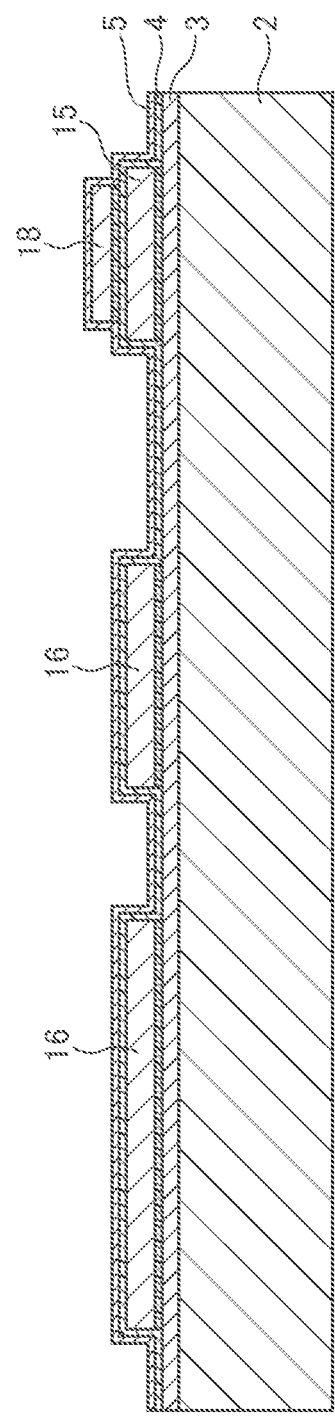
Figure 17:
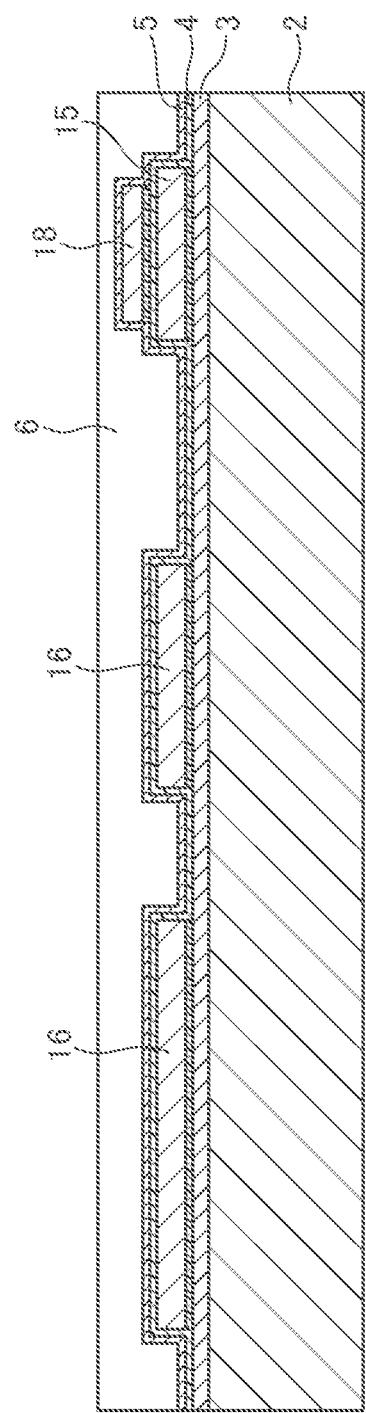
Figure 18:
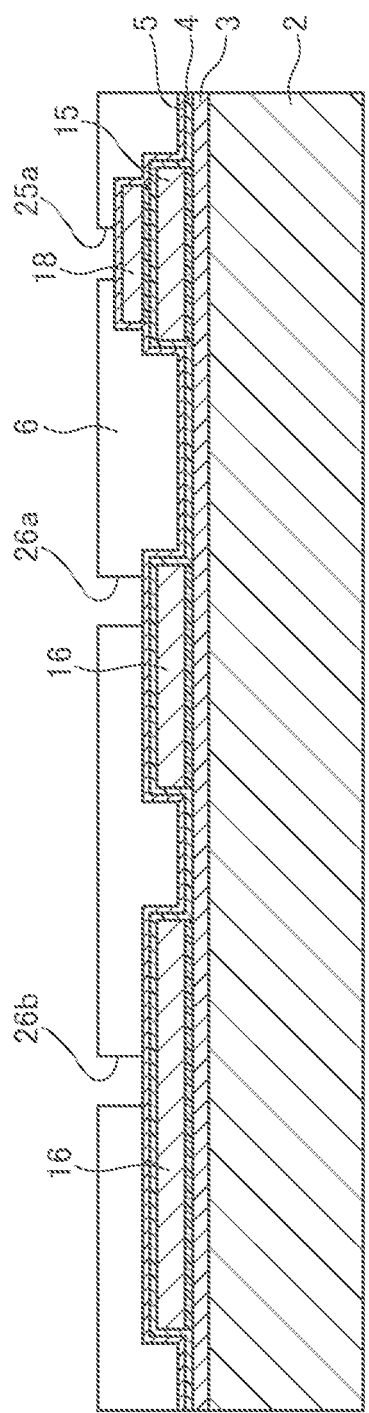

Then, the passivation film 5 is formed so as to cover the conductive layers M1 and MM as illustrated in FIG. 16, followed by formation of the insulating layer 6 as illustrated in FIG. 17. The formed insulating layer 6 is then patterned to form the vias 25a, 26a, and 26b as illustrated in FIG. 18. The passivation film 5 that covers the conductive pattern 18 is exposed to the bottom portion of the via 25a, and the passivation film 5 that covers the conductive pattern 16 is exposed to the bottom portions of the vias 26a and 26b.

Figure 19:
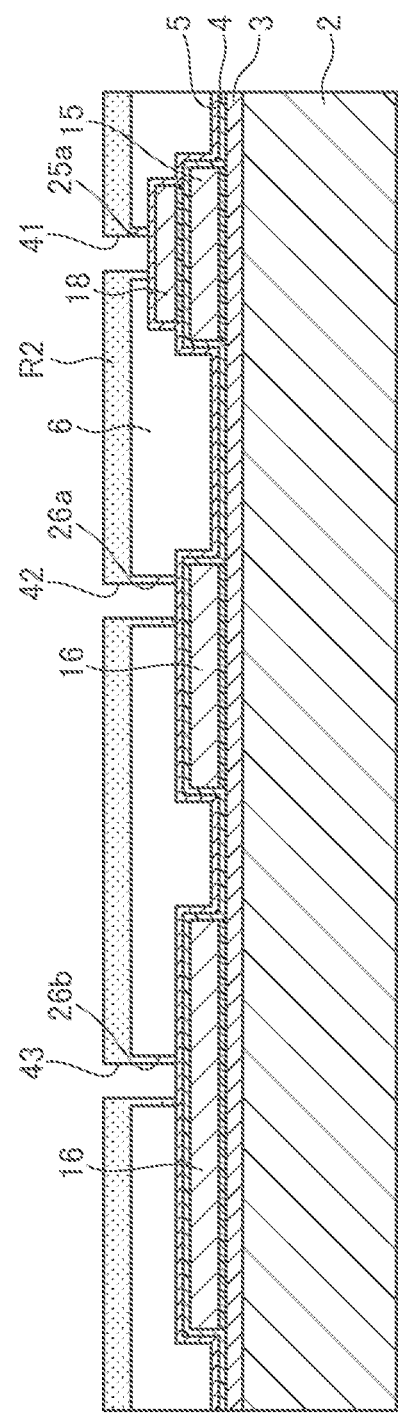
Figure 20:
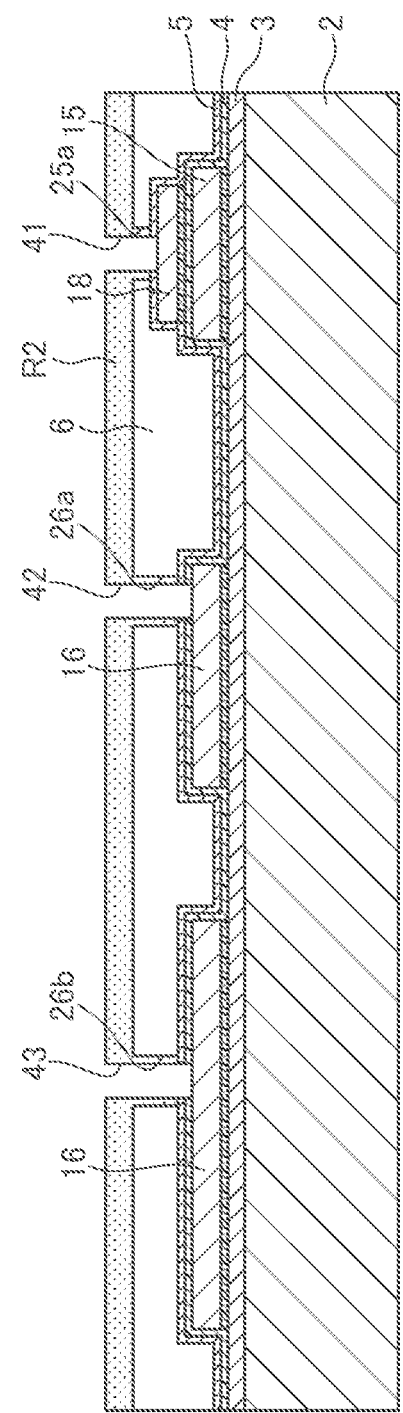

Then, as illustrated in FIG. 19, a resist layer R2 is formed on the insulating layer 6, followed by formation of openings 41 to 43 that overlap the vias 25a, 26a, and 26b, respectively, in the resist layer R2. As a result, the passivation film 5 that covers the upper surfaces of the conductive patterns 16 and 18 is exposed through the openings 41 to 43. In this state, ion milling or other method is applied to remove the passivation film 5 exposed to the opening 41 and remove the passivation film 5 and the dielectric film 4 both exposed to the openings 42 and 43, thereby exposing the upper surfaces of the conductive patterns 16 and 18, as illustrated in FIG. 20.

Figure 21:
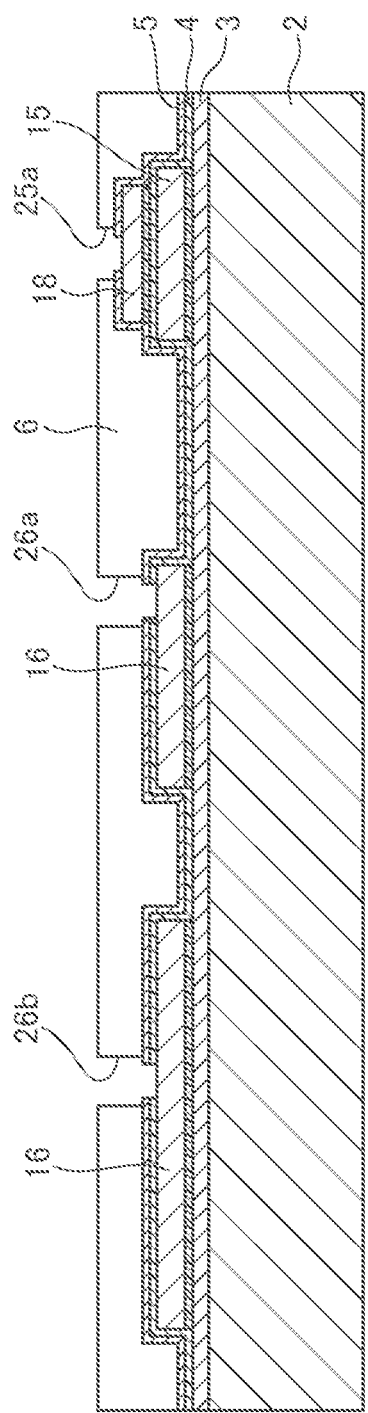
Figure 22:
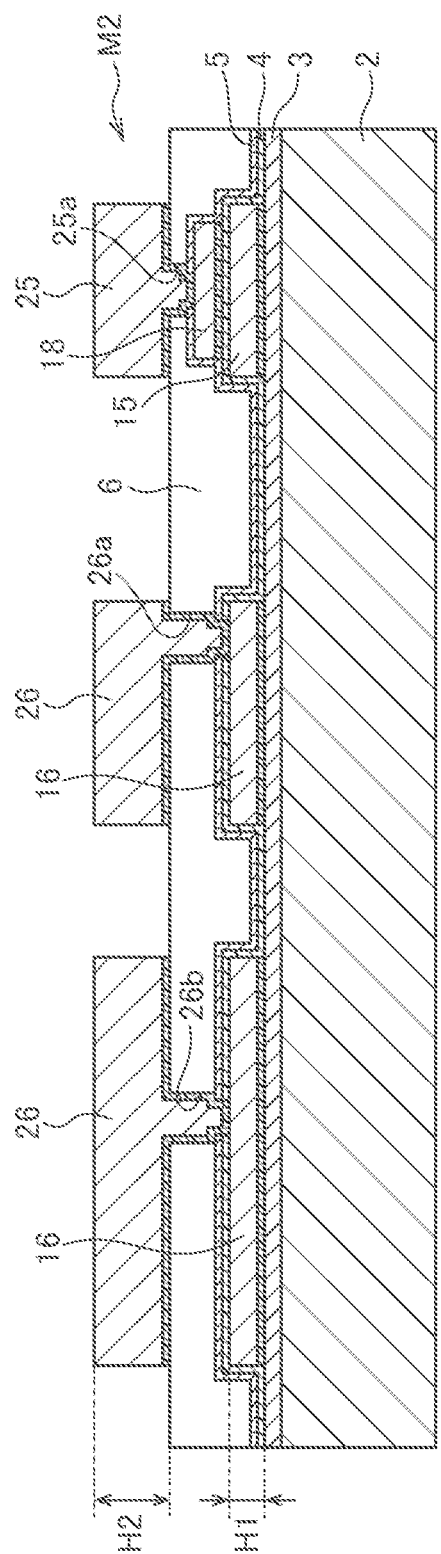

Then, the resist layer R2 is removed as illustrated in FIG. 21, and then the conductive layer M2 is formed on the insulating layer 6 using the same method as the formation method for the conductive layer M1 as illustrated in FIG. 22. The conductor thickness of the conductive layer M2 is H2 (>H1). Subsequently, the insulating layer 7 is formed so as to cover the conductive layer M2, the via 36a is formed in the insulating layer 7, and the conductive layer M3 is formed on the insulating layer 7 using the same method as the formation method for the conductive layer M1, whereby the electronic component 1 having the cross section illustrated in FIG. 2 is completed.

As described above, in the electronic component 1 according to the present embodiment, the conductive pattern 16 belonging to the conductive layer M1 to which the lower electrode belongs and the conductive pattern 26 higher in position than the conductive layer M1 are connected in parallel to constitute the inductor pattern, so that it is possible to reduce the resistance value of the inductor pattern while preventing interfacial peeling between the dielectric film 4 and the conductive layer M1.

It is apparent that the present invention is not limited to the above embodiments, but may be modified and changed without departing from the scope and spirit of the invention.

For example, although the present invention is applied to an LC filter in the above embodiment, the target electronic component of the present invention is not limited to the LC filter, but may be electronic components of other types.

Further, although the conductor thickness H1 of the conductive layer M1 is smaller than the conductor thickness H2 of the conductive layer M2 in the above embodiment, the present invention is by no means limited to this configuration.

What is claimed is:

1. An electronic component comprising:
 a first conductive layer including a lower electrode and a first inductor pattern;
 a dielectric film that covers the lower electrode;
 an upper electrode laminated on the lower electrode through the dielectric film;
 an insulating layer that covers the first conductive layer, dielectric film, and upper electrode; and
 a second conductive layer formed on the insulating layer and including a second inductor pattern,
 wherein the first and second inductor patterns are connected in parallel through via conductors penetrating the insulating layer.

2. The electronic component as claimed in claim 1, wherein the first conductive layer is smaller in thickness than the second conductive layer.

3. The electronic component as claimed in claim 1, wherein the first and second inductor patterns have substantially a same pattern shape.

4. The electronic component as claimed in claim 1, wherein the via conductors are formed so as to connect the first and second inductor patterns at their both ends.

5. The electronic component as claimed in claim 4, further comprising another via conductor connecting the first and second inductor patterns at a position between their both ends.

6. The electronic component as claimed in claim 1, further comprising a passivation film that covers the upper electrode at a region where the upper electrode is present and covers the dielectric film at a region where the upper electrode is absent,
 wherein the dielectric film and the passivation film are made of an inorganic insulating material.

* * * * *